United States Patent [19]
Ahonen et al.

[11] Patent Number: 5,148,262
[45] Date of Patent: Sep. 15, 1992

[54] RELIABLE SUPERCONDUCTING LINK FOR SUPERCONDUCTING THIN FILM COMPONENTS WITH U-SHAPED END PORTIONS

[75] Inventors: Antti I. Ahonen, Helsinki; Matti J. Kajola, Espoo; Juha T. A. Simola, Helsinki, all of Finland

[73] Assignee: Neuromag Oy, Finland

[21] Appl. No.: 723,934

[22] Filed: Jul. 1, 1991

[30] Foreign Application Priority Data

Aug. 17, 1990 [FI] Finland .................. 904071

[51] Int. Cl.$^5$ ............ H01L 23/48; H01L 29/44; H01L 49/00; H01B 12/00
[52] U.S. Cl. ........................ 357/68; 357/67; 357/70; 357/85; 357/69; 505/703; 505/704; 505/813; 505/927; 505/1
[58] Field of Search ............ 357/5, 68, 69, 85, 67, 357/70; 505/703, 704, 705, 813, 821, 925, 926, 927

[56] References Cited

U.S. PATENT DOCUMENTS

| | | | |
|---|---|---|---|
| 3,855,693 | 12/1974 | Umbaugh | 357/69 |
| 4,660,061 | 4/1987 | Sweeny et al. | 357/5 |
| 4,963,523 | 10/1990 | Ekin et al. | 505/706 |

FOREIGN PATENT DOCUMENTS 54-49066  4/1979  Japan ...................... 357/69

OTHER PUBLICATIONS

S. Williamson, M. Hoke, G. Stroink, M. Kotani, *Advances in Magnetism*, 1989, pp. 653–656.

Primary Examiner—Rolf Hille
Assistant Examiner—Mahshid Saadat
Attorney, Agent, or Firm—Andrus, Sceales, Starke & Sawall

[57] ABSTRACT

A reliable superconducting contact for superconducting thin film components, based on soft superconducting materials, and a method for making the contacts. A wire blank is squeezed to a thin plate and then this plate is cut into slabs used in the bonding. The ends of the slabs are longitudinally cut so that double or multiple parallel joints can be made. The slabs have elastic, bent central portions for absorbing stresses and stiff ends having a U-beam shape joined to the components. The U-beam shape may be formed by the soldering tool used to make the joints. The ribbon-like character, thinness and other features of the bonding slab permit a precise control of the bonding temperature, reduce the strain and bending forces caused by thermal contraction, and prevent the contact from peeling off while cooling the superconducting component to the operational temperature.

7 Claims, 2 Drawing Sheets

RELIABLE SUPERCONDUCTING LINK FOR SUPERCONDUCTING THIN FILM COMPONENTS WITH U-SHAPED END PORTIONS

BACKGROUND OF THE INVENTION

A reliable superconducting link, resistant to thermal cycling, is necessary in the construction of multicomponent superconducting devices, such as multichannel magnetometers, where simultaneous faultless operation of several superconducting devices is required. Such devices are used, for example, in the detection of feeble biomagnetic signals from the human brain.

Superconducting contacts between electronic components fabricated by thin film technology on substrates, such as silicon wafers, quartz, sapphire or glass, are technically problematical for the following reasons. 1) The electrical contact must be superconducting which requires a clean metal-to-metal contact between the bonding wire and the thin film. 2) The differences in thermal contraction of the various construction materials (silicon, lead, tin, niobium, printed circuit board made of fiber glass) lead to considerable thermal stresses at the joints because, in order to achieve superconductivity, the devices must be cooled far below their fabrication temperature. 3) Fixing the broken contacts at the operation temperature is impossible. Therefore, especially in devices comprising a large number of superconducting components, the joints must be extremely reliable and resistant to thermal cycling so that, when warming up the device to fix a link, one does not break any of the other parallel joints.

The prior art of superconducting bonding technology utilizes lead, tin-lead or niobium wires because these materials are sufficiently soft for mechanical bonding and their superconducting transition temperatures are well above the liquid helium temperature (e.g. S. Kiryu et al. in Advances in Biomagnetism, eds. S. J. Williamson, M. Hoke, G. Stroink, M. Kotani, Plenum Press, New York 1990). Lead, tin and their alloys melt at low temperatures (200°-400° C.) so that the softening of these materials slightly below the melting point can be utilized in the bonding. Ultrasound rather than heating is used when bonding with niobium wires because the melting point of Nb is very high (2470° C.). Compared to lead, niobium wire is also stiff so that to avoid too high stresses at the joints, either long or very thin wires ($<10\mu m$) must be used. Thin wires are difficult to handle and long wires come off easily during further handling of the bonded device. Long wires also require extra space and, especially in the magnetometer applications, form parasitic superconducting pickup loops. Tin and lead are too soft to be bonded with ultrasound. Wires made of these materials are usually pressed against the bonding pad of the thin film device by aid of a small, hot soldering tip. However, because typical substrate materials are good conductors of heat, these wires melt easily and get stuck on the soldering tip before the intended proper softening at the wire-thin film interface. The resulting joint may be mechanically weak and come off in cooling. Or, it may not be superconducting throughout. Even if the bonding is successful, the stress at the joint, caused by the relatively thick wire (40-100$\mu$m), may break the bond during cooling.

SUMMARY OF THE INVENTION

The present invention is directed to a new type of superconducting lead or tin-lead link and to a method of forming same, by which the problems associated with the prior art techniques described above can be avoided. The features, also described above, heretofore characteristic to the superconducting joint, made with prior art techniques, can similarly be avoided.

BRIEF DESCRIPTION OF THE DRAWINGS

The invention is described in detail below, with reference to FIGS. 1 to 3, where in FIG. 1 the shaping of a contact wire blank into a thin, sliced contact slab is described.

DETAILED DESCRIPTION OF THE PREFERRED EMBODIMENT

Figure 1:
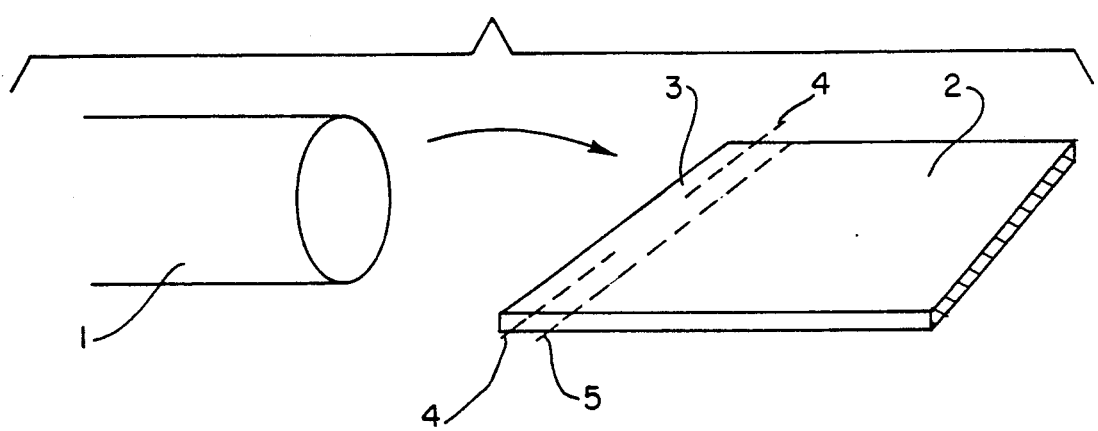

As shown in FIG. 1, the wire blank 1, of about 100 $\mu$m diameter, is pressed or rolled into a plate 2, which is about 10$\mu$m thick and 3-4 mm wide. This plate is sliced with the desired number of partial cuts 4, and then detached from the blank with a long cut 5 into a final bonding slab 3.

Figure 2A:
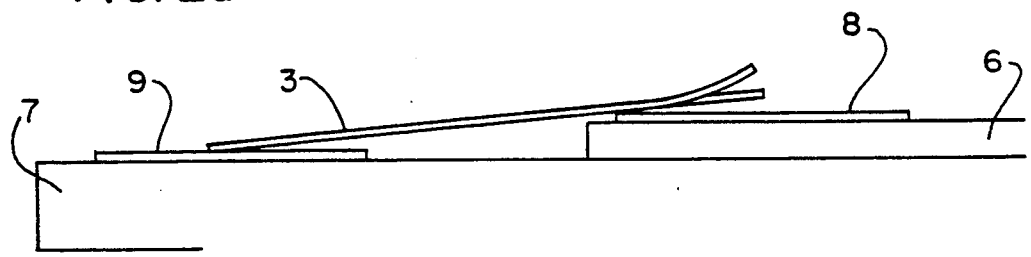
FIGS. 2a and 2b show the mounting of the slab.
Figure 2B:
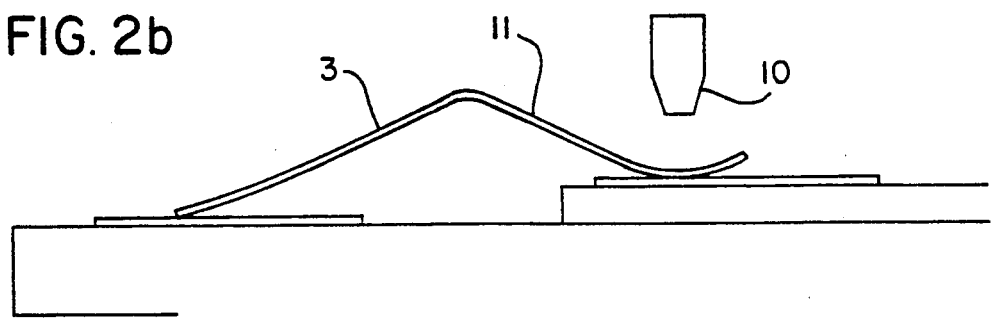

The slab is then placed to connect the devices located on two different substrates 6 and 7 so that its ends, as shown in FIG. 2a, rest on the contact pads 8 and 9. The slab is fixed from one of its ends by pressing with the hot soldering tip 10 against the bonding pad 8. After that, the slab is bent as shown in FIG. 2b and bonded from the other end. Each of the split ends of slab 3, formed by partial cuts 4 are bonded to the respective contact pad 8, 9.

When doing thermal bonding with a squeezed, thin strip-like bonding wire characteristic to this invention the temperature of the relatively large planar interface between the flat wire and the bonding pad is essentially equal to the temperature of the bonding tip. Thus, the bonding temperature is easily controlled and can be maintained high enough, to ensure a good metal-to-metal contact at the joint, without melting the wire from the tip side.

Splitting of the bonding wire from one or both ends is easy because the wire is flat. Splitting allows making parallel, independent multiple contacts with one wire. This adds to the reliability of multijoint devices as follows. Let us assume that the device consists of N individual elements, and the functioning of each element depends on two joints in series (current in and out). If the failure probability of one contact in cooling is p, and each of the 2N contacts comprises a single bond, the probability of a successful cooling of the entire N-component device is $P_1=(1-p)^{2N}$. If double contacts are used instead, the probability of success becomes $P_2=(1-p^2)^{2N}$. To avoid excessive thermal cycling of the entire device one should, for example, be successful in every other cooling. That requires a success probability $P>0.5$. Thus, by assuming that, with the bonding technique used, one out of hundred contacts fail (p=0.01) one gets an upper bound for the feasible number of singly bonded elements $N<34$, whereas for double-bonded elements $N<3470$.

Figure 3:
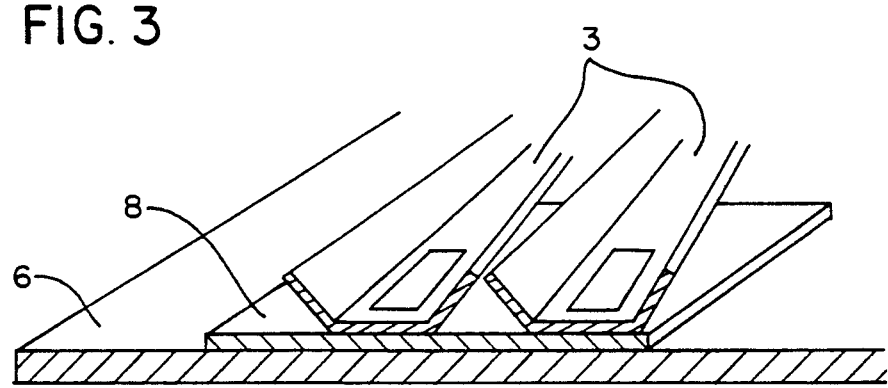
FIG. 3 illustrates a final double joint in cross section.
Figure 4:
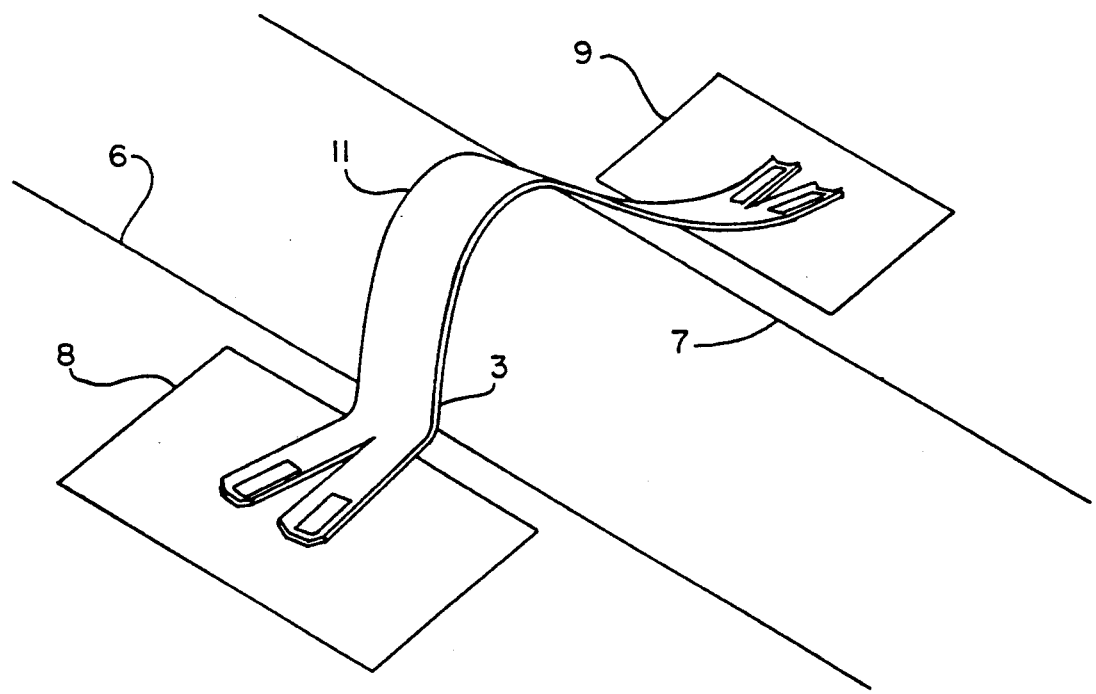
FIG. 4 is a perspective view of the link and final double joint.

FIG. 3 is a cut view of the completed double joint showing the U-beam like deformation of the joint region. The slab adapts to the relative motion of the bonding pads, caused by the differences in the thermal contraction, by bowing at the intentional bend 11 far from the U-beam like bonding regions, as shown in FIG. 4.

By using a proper pressing force and temperature of the bonding tip, one is able to shape the bonding slab described in this invention into a U-beam shape around the joint. This makes the slab stiff at the joint and prevents it from coming off by peeling. When the different parts of the device contract in cooling, the length of the bonding slab and the distance between the joints at the opposite ends of it change, causing strain and stress at the joints. These changes in dimensions are compensated by the bending of the thin ribbon-like bonding slab far from the joint region. The force needed to bend a beam is proportional to the width and to the third power of the thickness so that a $10\mu m \times 100\mu m$ slab needs a force which is roughly by factor $100/50 \times (10/50)^3 = 0.02$ smaller than that required by a typical $50\mu m$ round wire bent in the same way. Therefore, the durability of a link made of a thin slab is considerably increased over a round-wire link, especially when the joints are repeatedly warmed up and cooled down during the maintenance of the cryogenic device.

We claim:

1. A superconducting link for connecting a bonding pad to a superconducting, thin film component, or connecting two superconducting, thin film components, said link being formed of an elongated strip of thin, soft, superconducting material and having a medial portion interposed between end portions, said end portions being suitable for connection to a bonding pad or superconducting, thin film component, the material in said medial portion being flat in a direction transverse to the direction of elongation of said strip, said medial portion being bent in the direction of elongation of said strip for being deformable responsive to thermally generated stresses in said link, the material in said end portions having a U-shape in a direction transverse to the direction of elongation of said strip for rendering said end portions stiff along the direction of elongation of said strip, said stiff end portions resisting separation of said link from a bonding pad or superconducting, thin film component, and said medial portion absorbing thermally generated stresses to prevent their application to the connection formed at said end portions.

2. A superconducting link according to claim 1 wherein at least one of said end portions is split to form at least a pair of branch end portions, each of which has a U-shape in a direction transverse to the direction of elongation of said strip.

3. A superconducting link according to claim 1 wherein the thickness of said thin material is 5–200 times smaller than the width of said strip.

4. A superconducting link according to claim 2 wherein the thickness of said thin material is 5–200 times smaller than the width of said strip.

5. A superconducting link according to claim 1 wherein said end portions of said link are formed into said U-shape by a heated implement having a flat end with an area less than that of an end portion and a temperature below the melting point of the material of said link.

6. A superconducting link according to claim 2 wherein said branch end portions of said link are formed into said U- shape by a heated implement having a flat end with an area less than that of a branch end portion and a temperature below the melting point of the material of said link.

7. A superconducting link according to claim 1 wherein said elongated strip of thin material is formed of a flattened, round wire.

* * * * *